(12) United States Patent
Mortezaei

(10) Patent No.: US 12,732,180 B2
(45) Date of Patent: Sep. 8, 2026

(54) SOLID STATE RELAY MODULE WITH OVERCURRENT PROTECTION

(71) Applicant: Aptiv Technologies AG, Schaffhausen (CH)

(72) Inventor: Ali Mortezaei, Southfield, MI (US)

(73) Assignee: Aptiv Technologies AG, Schaffhausen (CH)

( * ) Notice: Subject to any disclaimer, the term of this patent is extended or adjusted under 35 U.S.C. 154(b) by 219 days.

(21) Appl. No.: 18/630,438

(22) Filed: Apr. 9, 2024

(65) Prior Publication Data

US 2024/0348241 A1 Oct. 17, 2024

Related U.S. Application Data

(60) Provisional application No. 63/459,585, filed on Apr. 14, 2023.

(51) Int. Cl.
*H03K 17/08* (2006.01)

(52) U.S. Cl.
CPC .................................... *H03K 17/08* (2013.01)

(58) Field of Classification Search
CPC .. H03K 17/08; H03K 17/687; H03K 17/0822; H02H 3/087; H02H 3/08; H02H 3/243; H02H 7/12; H02H 1/00; H02H 3/02; H02H 3/093
USPC ........................................................ 361/2–13
See application file for complete search history.

(56) References Cited

U.S. PATENT DOCUMENTS

| | | | | |
|---|---|---|---|---|
| 9,742,185 | B2 * | 8/2017 | Wang | H02H 3/087 |
| 2017/0054438 | A1 * | 2/2017 | Handy | H02H 3/05 |
| 2017/0104327 | A1 * | 4/2017 | Nojima | H02H 3/44 |
| 2017/0294907 | A1 * | 10/2017 | Volke | H03K 17/082 |
| 2019/0296731 | A1 | 9/2019 | Sakai | |
| 2022/0155383 | A1 * | 5/2022 | Yang | G01R 19/16566 |
| 2023/0221380 | A1 * | 7/2023 | Shea | H02H 5/12 361/42 |
| 2024/0217355 | A1 * | 7/2024 | Hofer | B60L 53/60 |
| 2024/0274389 | A1 * | 8/2024 | Domejean | H01H 71/04 |

FOREIGN PATENT DOCUMENTS

WO 2022175107 A1 8/2022

OTHER PUBLICATIONS

"Extended European Search Report"; European Patent Office; mailed Sep. 4, 2024; 9 Pages.

(Continued)

*Primary Examiner* — Danny Nguyen
(74) *Attorney, Agent, or Firm* — Billion & Armitage

(57) ABSTRACT

A solid state relay module includes a first electronic switch configured to establish and break an electrical connection between a first voltage inputs and outputs. The module has a drive circuit connected to the first electronic switch configured to turn the first electronic switch on and off due to commands from an electronic controller. The module has a shunt overcurrent detection (OCD) circuit and a desaturation OCD circuit in communication with the electronic controller. The electronic controller is configured to command the drive circuit to turn off the first electronic switch when the shunt OCD or the desaturation OCD circuits detect an overcurrent condition.

20 Claims, 13 Drawing Sheets

(56) References Cited

OTHER PUBLICATIONS

Han, Xu , et al., "Integrated High-Speed Over-Current Protection Circuit for GaN Power Transistors"; 2019 31st International Symposium on Power Semiconductor Devices and ICS (ISPSD); IEEE; pp. 275-278, XP033574684, DOI: 10.1109/ISPSD.2019.8757685 ISBN: 978-1-7281-0580-2; published May 19, 2019; 4 pages.

* cited by examiner

SOLID STATE RELAY MODULE WITH OVERCURRENT PROTECTION

CROSS-REFERENCE TO RELATED APPLICATIONS

This application claims the benefit of and priority to U.S. Provisional Application 63/459,585, titled "Miniature Solid State Relay Module", filed Apr. 14, 2023, the contents of which are incorporated by reference herein.

TECHNICAL FIELD

This disclosure is directed to an electrical relay module, and more particularly to a solid state relay module with overcurrent protection.

BACKGROUND

Mechanical contactors are heavy-duty relays that are used as switches to open and close electrical circuits in high voltage, e.g., greater than 50 volt, applications. However, mechanical contactors are slow and have a limited lifespan ending in mechanical or electrical failure of the contactors. These failures may increase costs of warranty claims for manufacturers using these mechanical devices.

SUMMARY

In some aspects, the techniques described herein relate to a solid state relay module, including a first electronic switch configured to establish and break an electrical connection between a first voltage input and a first voltage output; a drive circuit connected to the first electronic switch and configured to put the first electronic switch in a conductive state or in a nonconductive state due to commands from an electronic controller in communication with the drive circuit; a shunt overcurrent detection circuit in communication with the electronic controller; and a desaturation overcurrent detection circuit in communication with the electronic controller, wherein the electronic controller is configured to command the drive circuit to put the first electronic switch in the nonconductive state when the shunt overcurrent detection circuit or the desaturation overcurrent detection circuit detects an overcurrent condition.

In some aspects, the techniques described herein relate to a solid state relay module, including a first electronic switch configured to establish and break an electrical connection between a first voltage input and a first voltage output; and a drive circuit connected to the first electronic switch and configured to put the first electronic switch in a conductive state or in a nonconductive state due to commands from an electronic controller in communication with the drive circuit.

BRIEF DESCRIPTION OF THE DRAWINGS

The present invention will now be described by way of example with reference to the accompanying drawings, in which.

DETAILED DESCRIPTION

This disclosure is directed to a solid state relay (SSR) module with overcurrent protection. In contrast to traditional mechanical relays or contactors which uses spring loaded terminals, the SSR module described herein has the advantage of having no moving mechanical parts. The electrical switching is carried out by solid state components, e.g., MOSFETs. These solid state components have much better reliability than the mechanical contactors. These solid state components also have much faster response time which may be enhanced by pre-charging techniques. These solid state components are easily resettable and are much smaller than equivalent mechanical contactors.

A dedicated bypass relay and a resistor are typically used with conventional solid state relay modules to pre-charge capacitive elements in the electrical load before the main relay is closed in order to avoid a large in-rush current that could damage the relay module. This SSR module eliminates the dedicated bypass relay and a resistor by utilizing its ability to turn on and sense overcurrent conditions and then quickly turn off before overcurrent conditions persist, thereby using pulsed energy to change capacitive elements in the load. The SSR module repeatedly generates pulses until the load capacitor voltage is high enough to no longer cause an overcurrent in the SSR module. The SSR module may then stay on as commanded and may turn off if an overcurrent event or if the SSR module receives a command to turn off. The SSR module includes shunt based and desaturation overcurrent detection circuitry that are configured to responds quickly to protect the SSR module against high peak currents that could damage the SSR module or electrical load.

Figure 1:
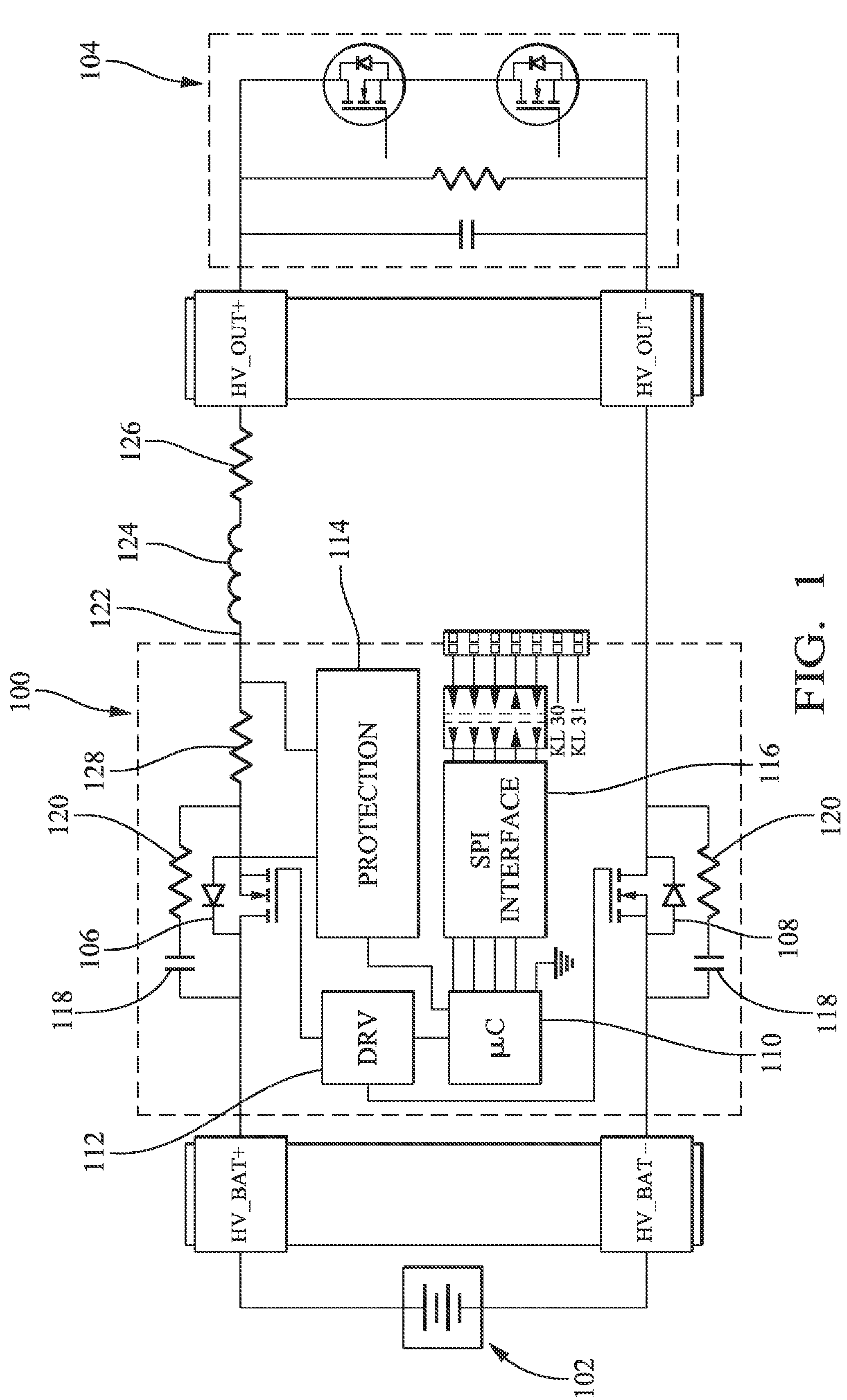
FIG. 1 illustrates a schematic electrical diagram of a miniature solid state relay (SSR) module according to some embodiments.

FIG. 1 shows a schematic electrical diagram of a non-limiting example of a miniature solid state relay module, hereafter referred to as the SSR module 100. The SSR module 100 is connected to an electrical power source, such as the battery 102, and an electrical load 104 as shown in FIG. 1. The SSR module 100 includes a solid state high side electronic switch 106 and a solid state low side electronic switch 108, e.g., metal oxide semiconductor field effect transistors (MOSFETs), controlled by an electronic controller 110, e.g., a microprocessor by means of a drive circuit 112. In alternative embodiments of the SSR module, the low side electronic switch 108 may be replaced with an electrical conductor. The SSR module 100 also includes protection circuitry 114 connected to the drive circuit 112 to detect overcurrent conditions and communication circuitry 116 connected to the electronic controller 110 to provide digital communication between the SSR module and other electronic systems, e.g., electronic systems in an electric vehicle. The SSR module 100 further includes snubber circuits having a capacitive component 118 and a resistive component 120 connected in parallel with the high side electronic switch 106 and the low side electronic switch 108 to protect these switches. The SSR module 100 includes a connector 122 that connects the SSR module 100 to the electrical load 104. The connector 122 between the SSR module 100 and the electrical load 104 may have resistive and inductive properties modeled here by the inductive element 124 and the resistive element 126.

The SSR module 100 in this example is configured to have a normal operating voltage of around 420 volts and withstand voltage transients of around 600 volts. Alternative examples of the SSR module 100 may have different operating voltage ranges. Examples of the electrical load 104 may be a DC to AC invertor, a DC-DC convertor, or a primarily resistive load, e.g., a heater.

Figure 2:
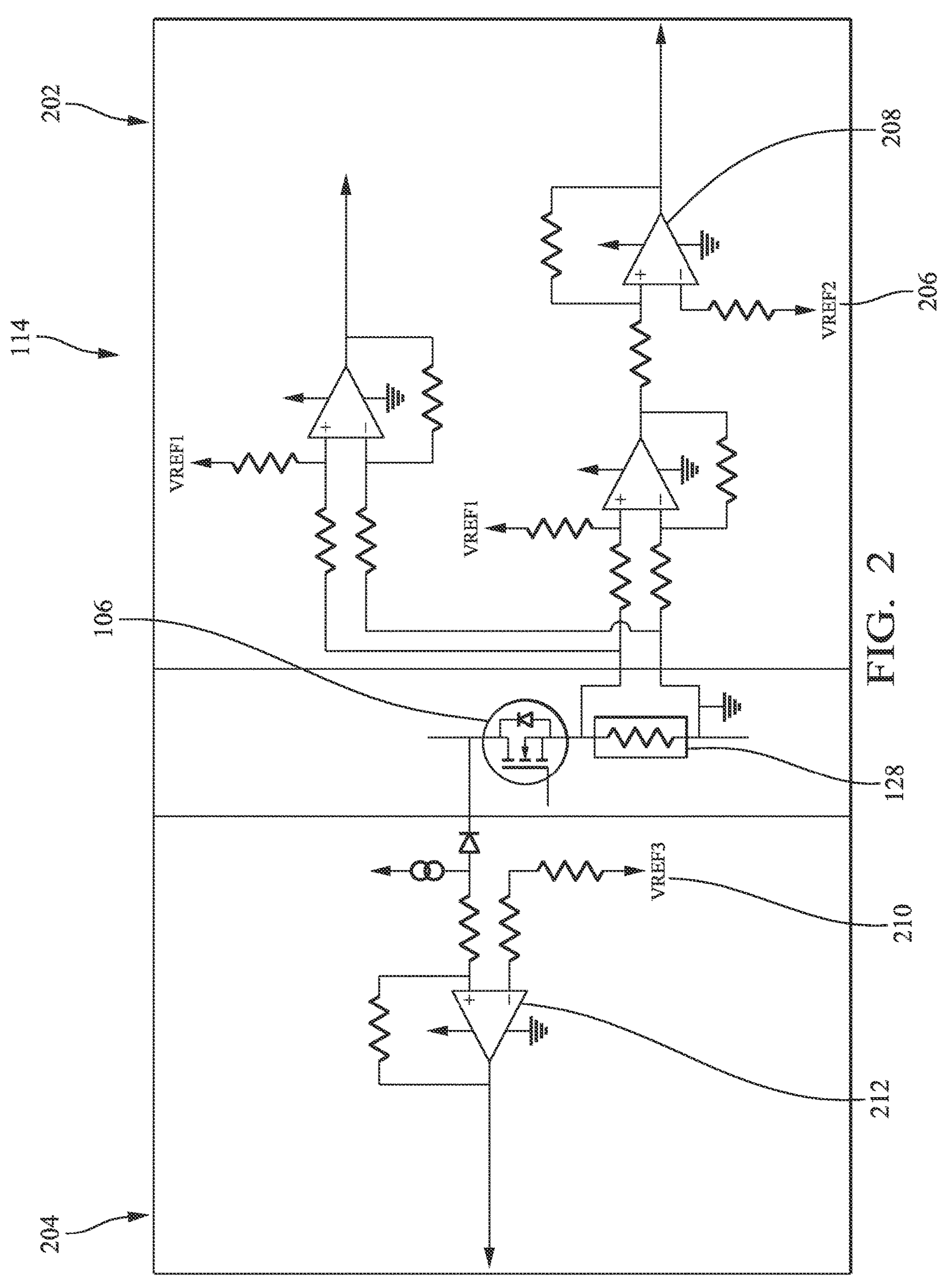
FIG. 2 illustrates a schematic electrical diagram of protection circuitry of the SSR module of FIG. 1 according to some embodiments.

FIG. 2 shows a detailed schematic electrical diagram of the protection circuitry 114 of the SSR module 100. The high side electronic switch 106 is connected to a shunt-based over current detection circuit, hereafter referred to as the shunt OCD circuit 202, and a desaturation-based overcurrent detection circuit, hereafter referred to as the DESAT OCD circuit 204. Without subscribing to any particular theory of operation, the shunt OCD circuit 202 detects an overcurrent condition by amplifying the voltage across a shunt resistor 128 in series with the high side electronic switch 106 and comparing it to a preset reference voltage 206 using the shunt comparator 208. The voltage measured across the shunt resistor 128 is representative of the current provided at the output of the SSR module 100. Without subscribing to any particular theory of operation, the DESAT OCD circuit 204 detects an overcurrent condition by comparing the source to drain voltage of the high side electronic switch 106 to another preset reference voltage 210 using the DESAT comparator 212. The source to drain voltage of the high side electronic switch 106 will have a substantial increase when an overcurrent condition occurs. The source to drain voltage increase depends on the characteristic of the MOSFET and the gate drive condition.

Figure 3:
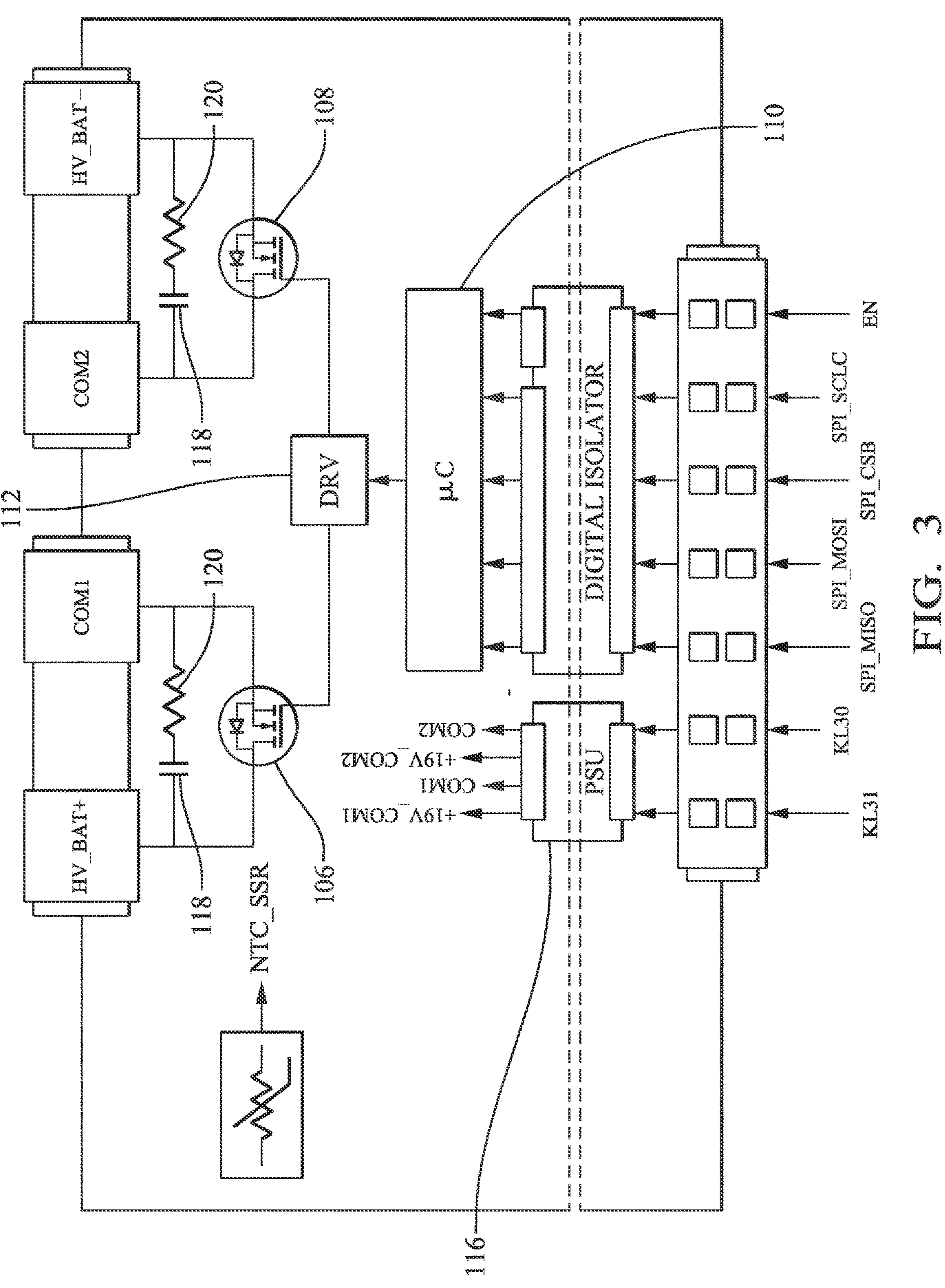
FIG. 3 illustrates a schematic electrical diagram of communication circuitry of the SSR module of FIG. 1 according to some embodiments.

FIG. 3 illustrates a schematic electrical diagram of communication circuitry 116 of the SSR module 100 in communication with the electronic controller 110, the drive circuit 112, and the high side electronic switch 106 and the low side electronic switch 108. In this example the communication circuitry 116 is connected to the electronic controller 110 and is configured to use a serial peripheral interface (SPI) communication protocol to provide digital communication between the SSR module 100 and other external devices. The KL31 and KL30 pins are the power input to the internal power supply unit (PSU) that provides isolated power to the electronic controller 110, the drive circuit 112, the protection circuitry 114, and the communication circuitry 116. The EN pin receives the on/off command to the SSR module 100. The remaining pins are for the SPI interface that allows the electronic controller 110 to communicate with external electronic devices.

Figure 4:
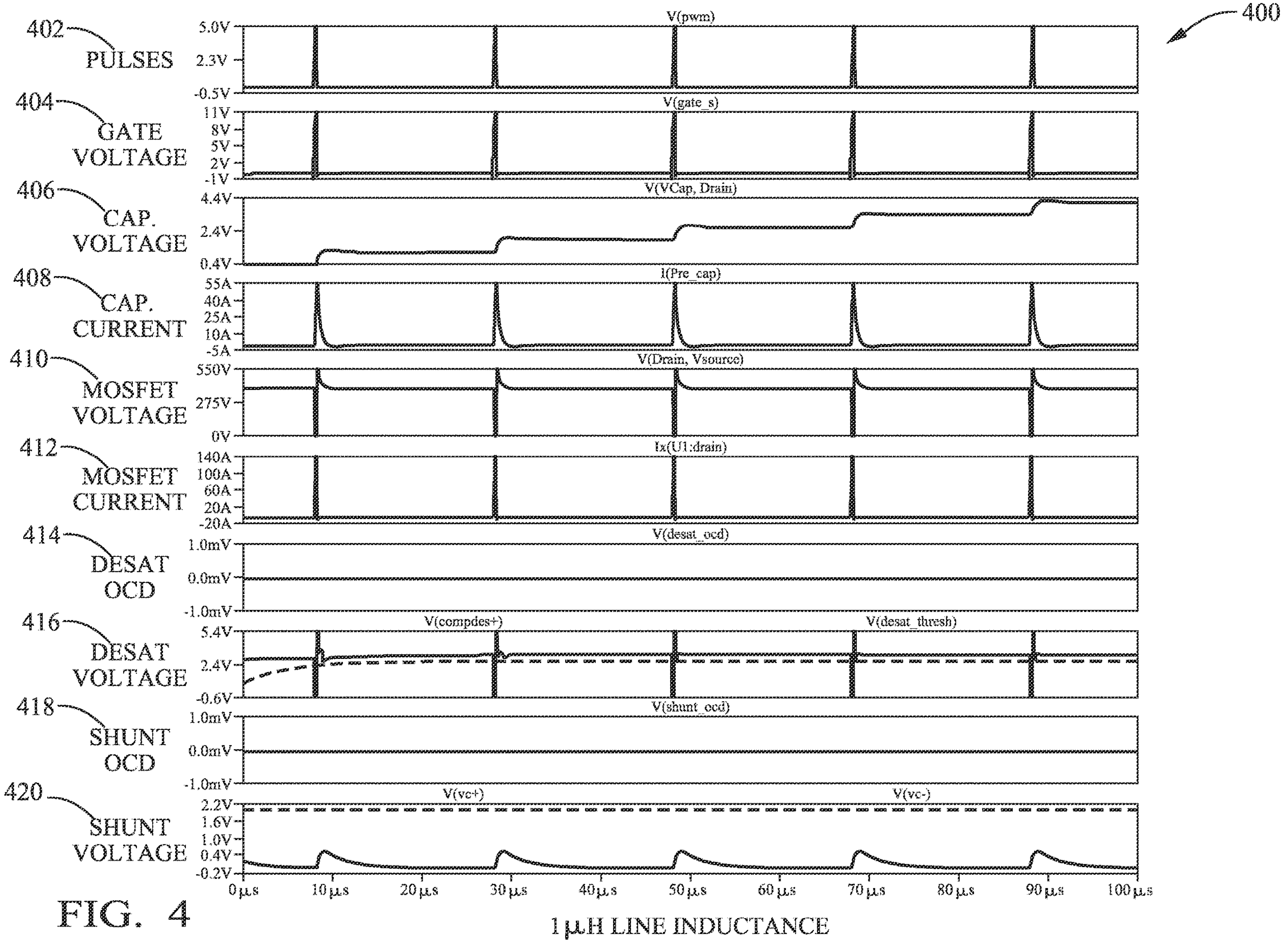
FIG. 4 illustrates graphs of various parameters for a first simulation of the SSR module of FIG. 1 pre-charging an electrical load according to some embodiments.

FIG. 4 shows results of a first simulation of the SSR module 100 pre-charging the electrical load 104. In this simulation, the high side electronic switch 106 has a 30 μF capacitance and 1 pH line impedance. The electrical load 104 is pre-charged by the electronic controller 110 commanding the drive circuit 112 to turn the high side electronic switch 106 on and off while turn the low side electronic switch 108 on in order to pre-charge the electrical load 104. The signal to control the high side electronic switch 106 is pulse width modulated signal. In this simulation, the PWM signal to the high side electronic switch 106 has about a 1% duty cycle with a frequency of about 50 kHz, i.e., the high side electronic switch 106 is on for a predetermined first time period of about 0.2 microseconds and off for a predetermined second time period of about 20 milliseconds. The duty cycle and frequency of the PWM signal be adjusted due to transient overcurrent conditions or by the electronic controller 110 based on a temperature of the electrical load 104. In this simulation, the electrical load 104 has an initial voltage of 0 volts.

FIG. 4 shows the wave forms of pre-charge pulses 402 input to the SSR module 100, the graphs of the voltage 404 at the gate of the high side electronic switch 106, the voltage 406 of the capacitive component 118, the current 408 through the capacitive component 118, the voltage 410 across the high side electronic switch 106, the current 412 through the high side electronic switch 106, the desaturation over current detection (DESAT OCD) signal 414, the DESAT comparator 212 voltage 416, the shunt over current detection (shunt OCD) signal 418, and the shunt comparator 208 voltage 420 are shown. The duration of the pre-charge pulses 402 are adjusted so the in-rush current through the high side electronic switch 106 remains within the safe operating area (SOA) of the high side electronic switch 106. As can be seen in FIG. 4, there are no false DESAT or shunt OCD signals 414, 418 during this simulation.

Figure 5:
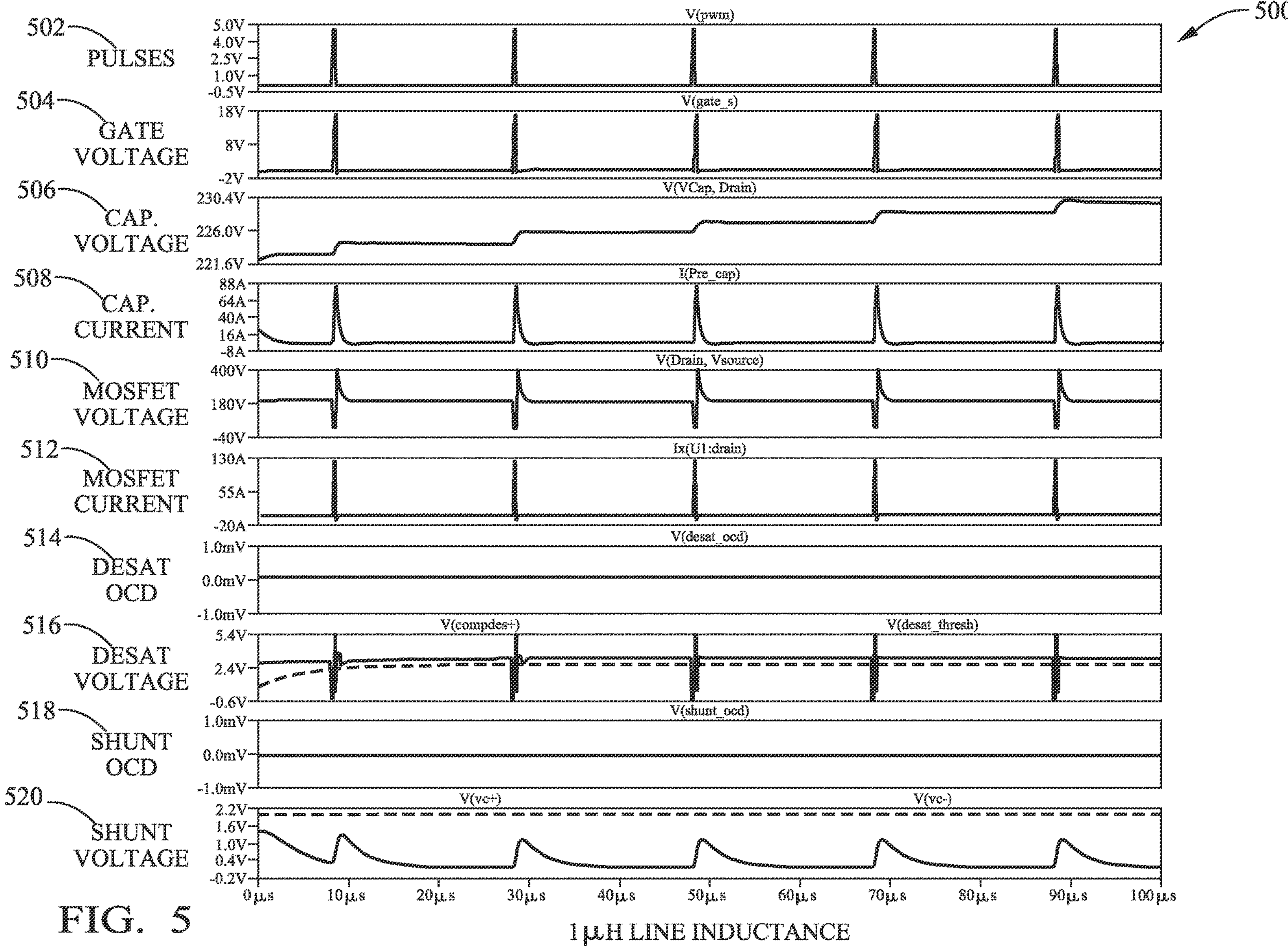
FIG. 5 illustrates graphs of various parameters for a second simulation of the SSR module of FIG. 1 pre-charging an electrical load according to some embodiments.

FIG. 5 shows results of a second simulation of the SSR module 100 pre-charging the electrical load 104. In this simulation, the PWM signal to the high side electronic switch 106 has about a 2.5% duty cycle with a frequency of about 50 kHz, i.e., the high side electronic switch 106 is on for a predetermined first time period of about 0.5 microseconds and off for a predetermined second time period of about 20 milliseconds. The initial voltage of the electrical load 104 is about 220 volts in this simulation. FIG. 5 again shows the wave forms of pre-charge pulses 502 input to the SSR module 100. The graphs of the voltage 504 at the gate of the high side electronic switch 106 of the high side electronic switch 106, the voltage 506 of the capacitive component 118, the current 508 through the capacitive component 118, the voltage 510 across the high side electronic switch 106, the current 512 through the high side electronic switch 106, the DESAT OCD signal 514, the DESAT comparator 212 voltage 516, the shunt OCD signal 518, and the shunt comparator 208 voltage 520 are shown. As can be seen in FIG. 5, there are no false DESAT or shunt OCD signals 514, 518 during this simulation.

Figure 6:
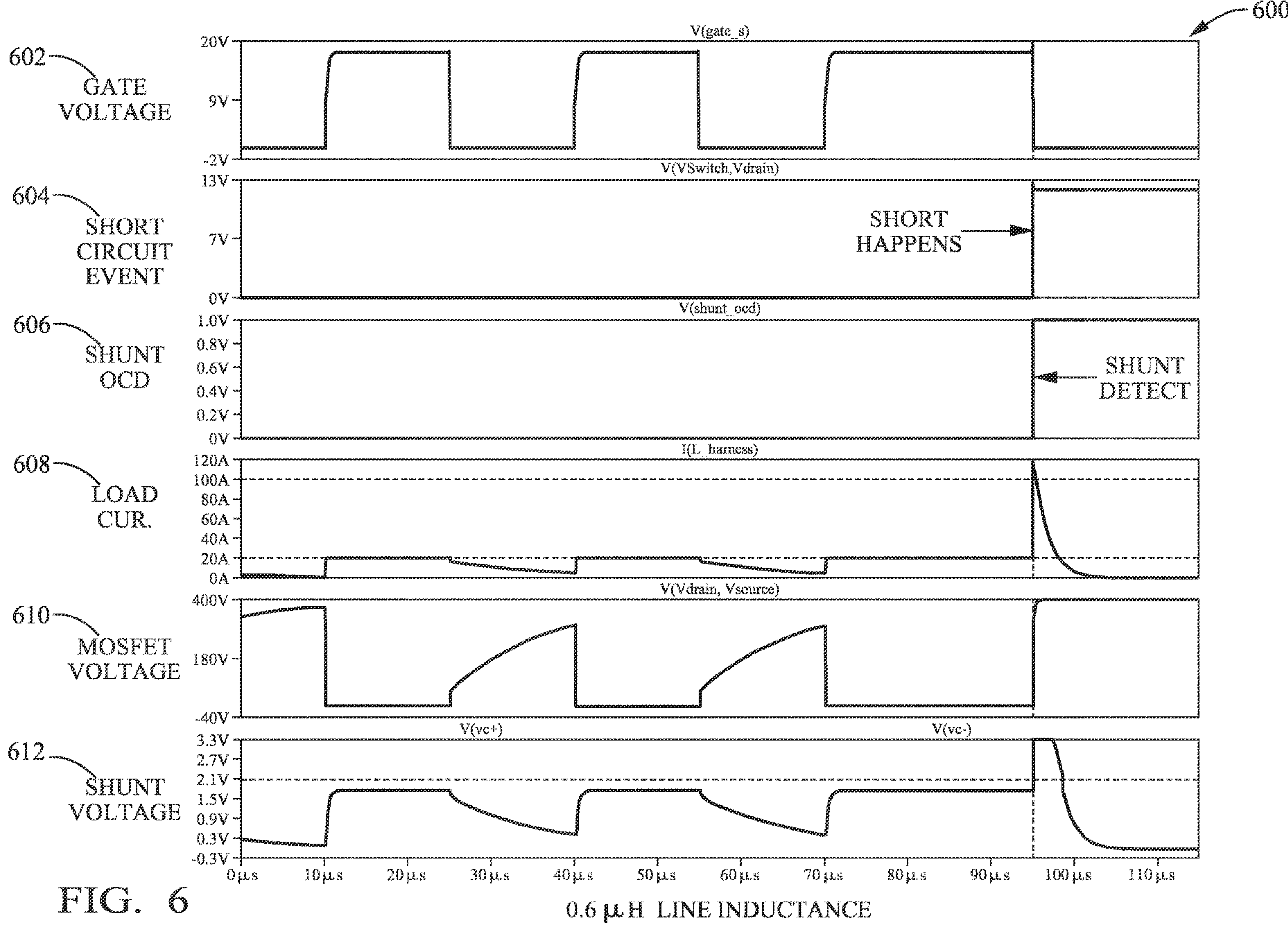
FIG. 6 illustrates graphs of various parameters for a first simulation of a shunt overcurrent event of the SSR module of FIG. 1 according to some embodiments.

FIG. 6 shows the results of a first simulation of a shunt overcurrent event of the SSR module 100. In this simulation, the high side electronic switch 106 has a 0.6 pH line impedance. The graphs of the voltage 602 at the gate of the high side electronic switch 106, the shunt event 604, the shunt OCD signal 606, the current 608 through the electrical load 104, the voltage 610 across the high side electronic switch 106, and the shunt comparator 208 voltage 612 are shown are shown in FIG. 6. As can be seen in FIG. 6, the SSR module 100 turns off the high side electronic switch 106 less than 150 nanoseconds after the shunt OCD signal 606 occurs. This fast response time to turn off the high side electronic switch 106 prevents current overshoot conditions from occurring. The shunt OCD circuit 202 is primarily responsible for the fast response time due to its direct and linear response. The shunt OCD circuit 202 can also provide output current measurements for the SSR module 100 which may be shared with external devices for system control. The DESAT OCD circuit 204 serves a secondary, back-up role for overcurrent detection.

Figure 7:
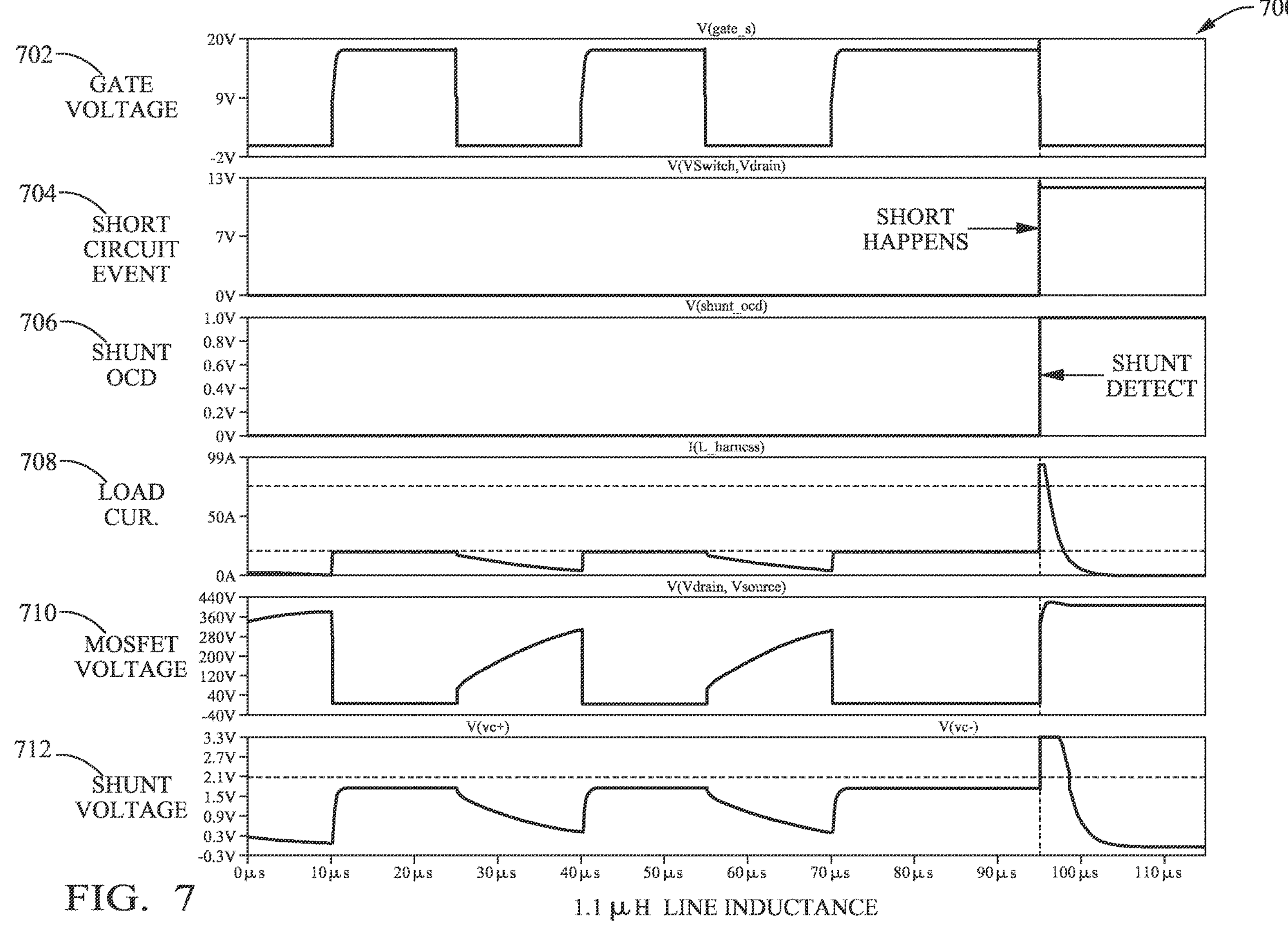
FIG. 7 illustrates graphs of various parameters for a second simulation of a shunt overcurrent event of the SSR module of FIG. 1 according to some embodiments.

FIG. 7 similarly shows the results of a second simulation of a shunt overcurrent event of the SSR module 100. In this simulation, the high side electronic switch 106 has a 1.1 pH line impedance. The graphs of the voltage 702 at the gate of the high side electronic switch 106, the shunt event 704, the shunt OCD signal 706, the current 708 through the electrical load 104, the voltage 710 across the high side electronic switch 106, and the shunt comparator 208 voltage 712 are shown are shown in in FIG. 7. Again, as can be seen in FIG. 7, the SSR module 100 turns off the high side electronic switch 106 less than 150 nanoseconds after the shunt OCD signal 706 occurs. This fast response time to turn off the high side electronic switch 106 prevents current overshoot conditions from occurring.

Figure 8:
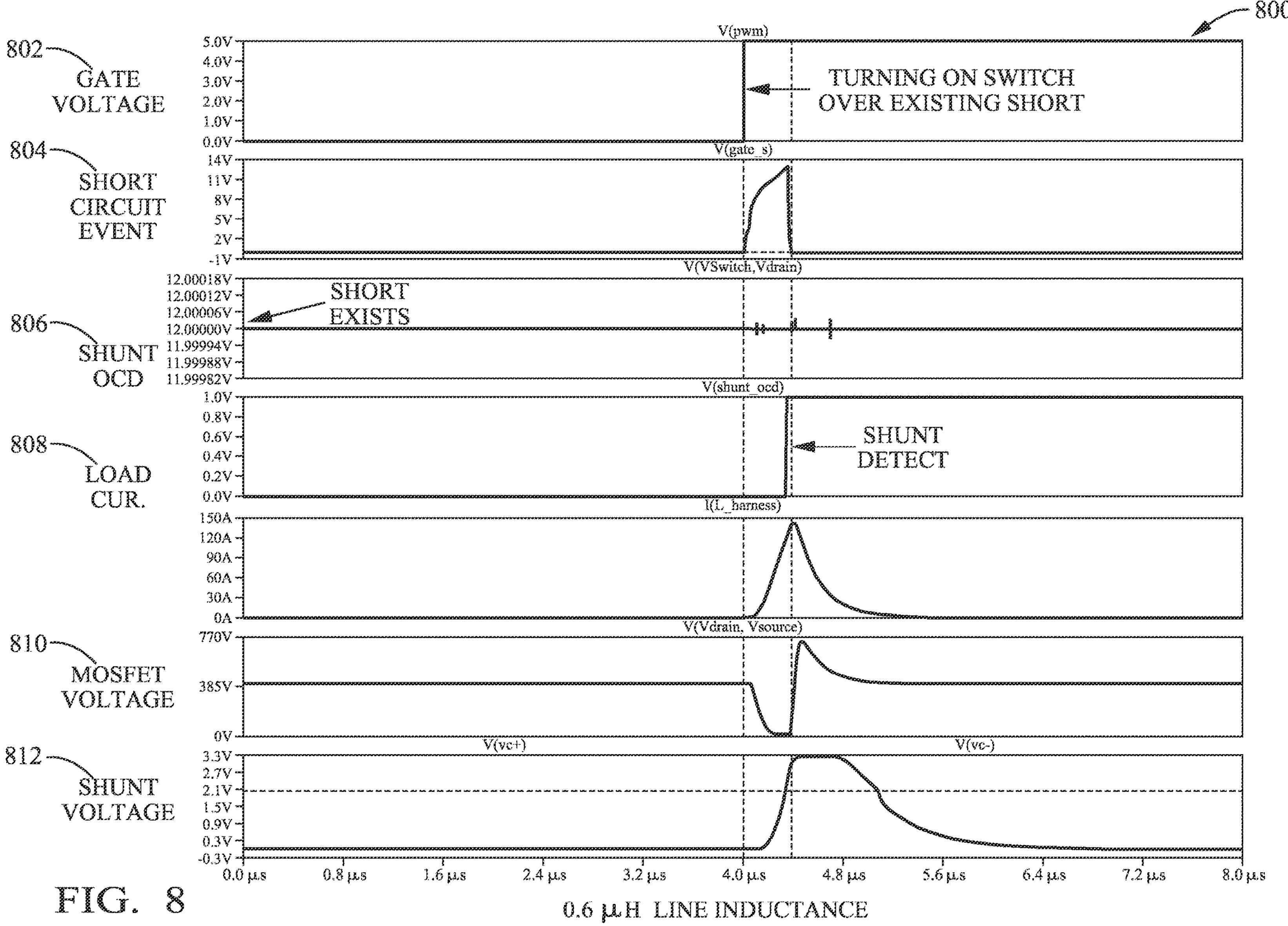
FIG. 8 illustrates graphs of various parameters for a third simulation of a shunt overcurrent event of the SSR module of FIG. 1 according to some embodiments.

FIG. 8 shows the results of a first simulation of the DESAT OCD circuit 204 of the SSR module 100. In this simulation, the high side electronic switch 106 has a 0.6 pH line impedance. The graphs of the voltage 802 at the gate of the high side electronic switch 106, the short circuit event 804, the shunt OCD signal 806, the current 808 through the electrical load 104, the voltage 810 across the high side electronic switch 106, and the shunt comparator 208 voltage 812 are shown in FIG. 8. As can be seen in FIG. 8, the SSR module 100 turns off the high side electronic switch 106 less than 390 nanoseconds after the shunt OCD signal 806 occurs.

Figure 9:
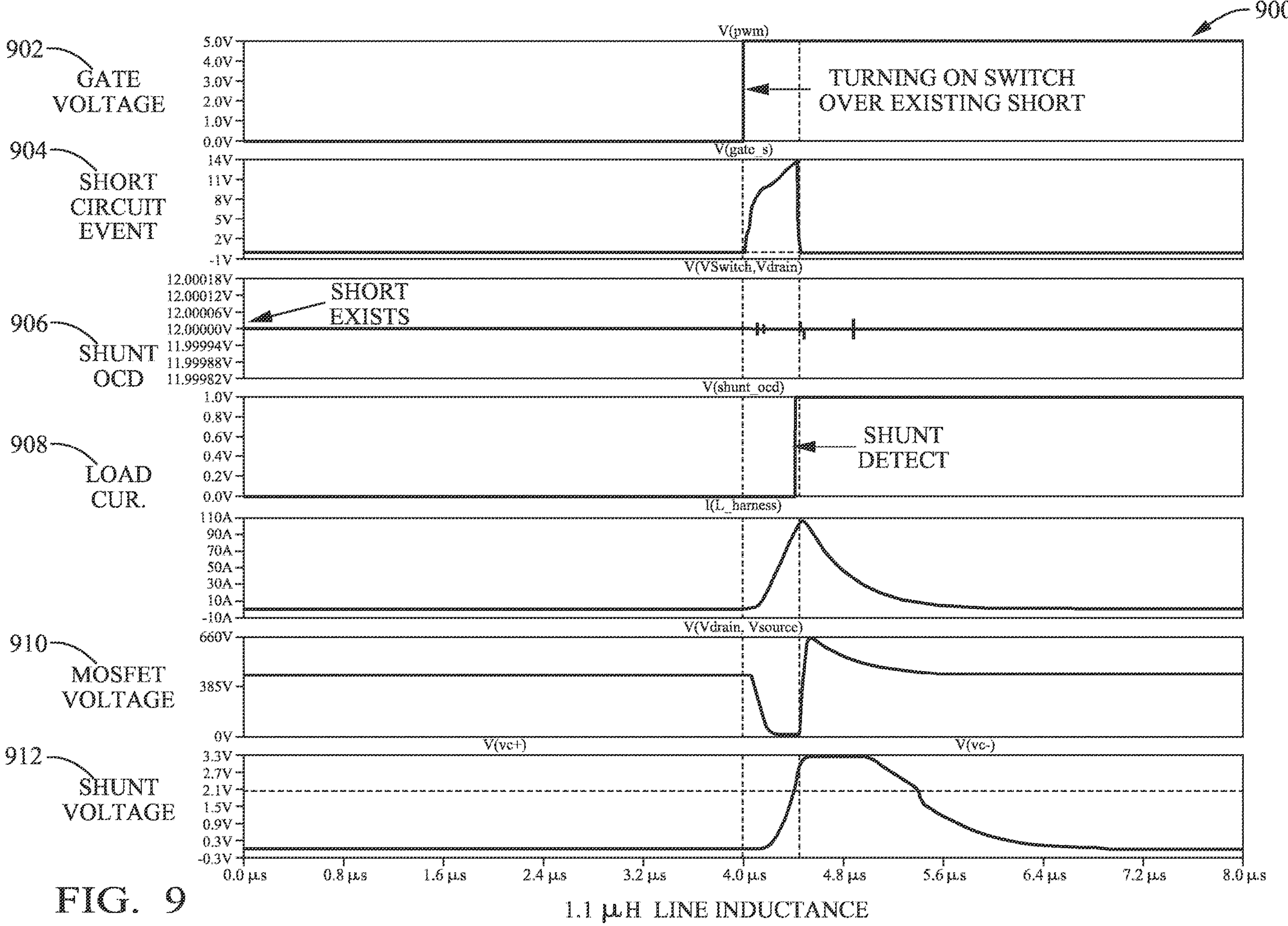
FIG. 9 illustrates graphs of various parameters for a fourth simulation of a shunt overcurrent event of the SSR module of FIG. 1 according to some embodiments.

FIG. 9 shows the results of a second simulation of a turn on over short of the SSR module 100 with shunt-based OCD. In this simulation, the high side electronic switch 106 has a 1.1 pH line impedance. The graphs of the voltage 902 at the gate of the high side electronic switch 106, the short circuit event 904, the shunt OCD signal 906, the current 908 through the electrical load 104, the voltage 910 across the high side electronic switch 106, and the shunt comparator 208 voltage 912 are shown in FIG. 9. As can be seen in FIG. 9, the SSR module 100 turns off the high side electronic switch 106 less than 390 nanoseconds after the shunt OCD signal 906 occurs.

Figure 10:
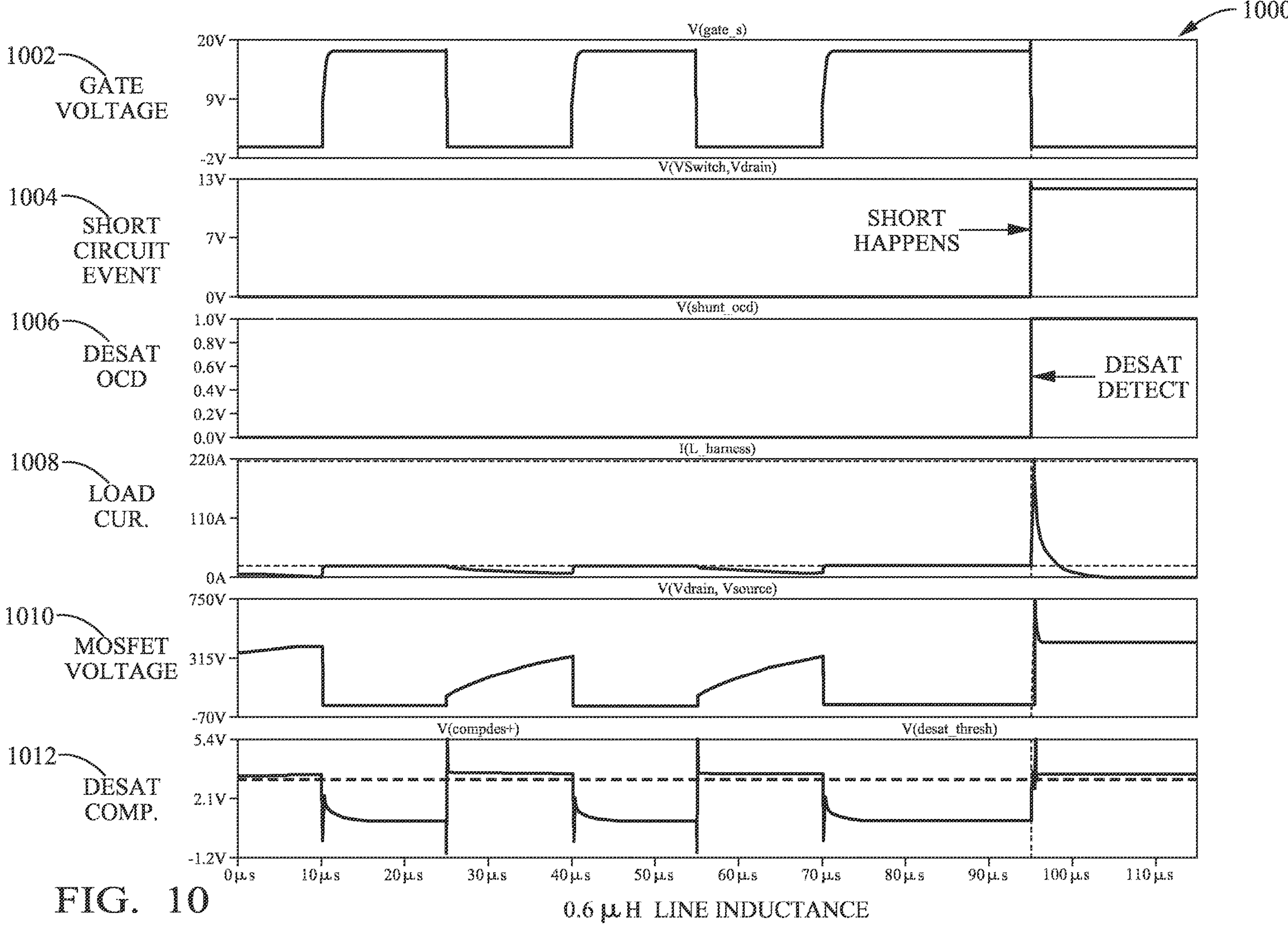
FIG. 10 illustrates graphs of various parameters for a first simulation of a desaturation-based over current event of the SSR module of FIG. 1 according to some embodiments.

FIG. 10 shows the results of a first simulation of the DESAT OCD circuit 204 of the SSR module 100. In this simulation, the high side electronic switch 106 has a 0.6 pH line impedance. The graphs of the voltage 1002 at the gate of the high side electronic switch 106, the short circuit event 1004, the DESAT OCD signal 1006, the current 1008 through the electrical load 104, the voltage 1010 across the high side electronic switch 106, and the DESAT comparator 212 voltage 1012 are shown in FIG. 10.

Figure 11:
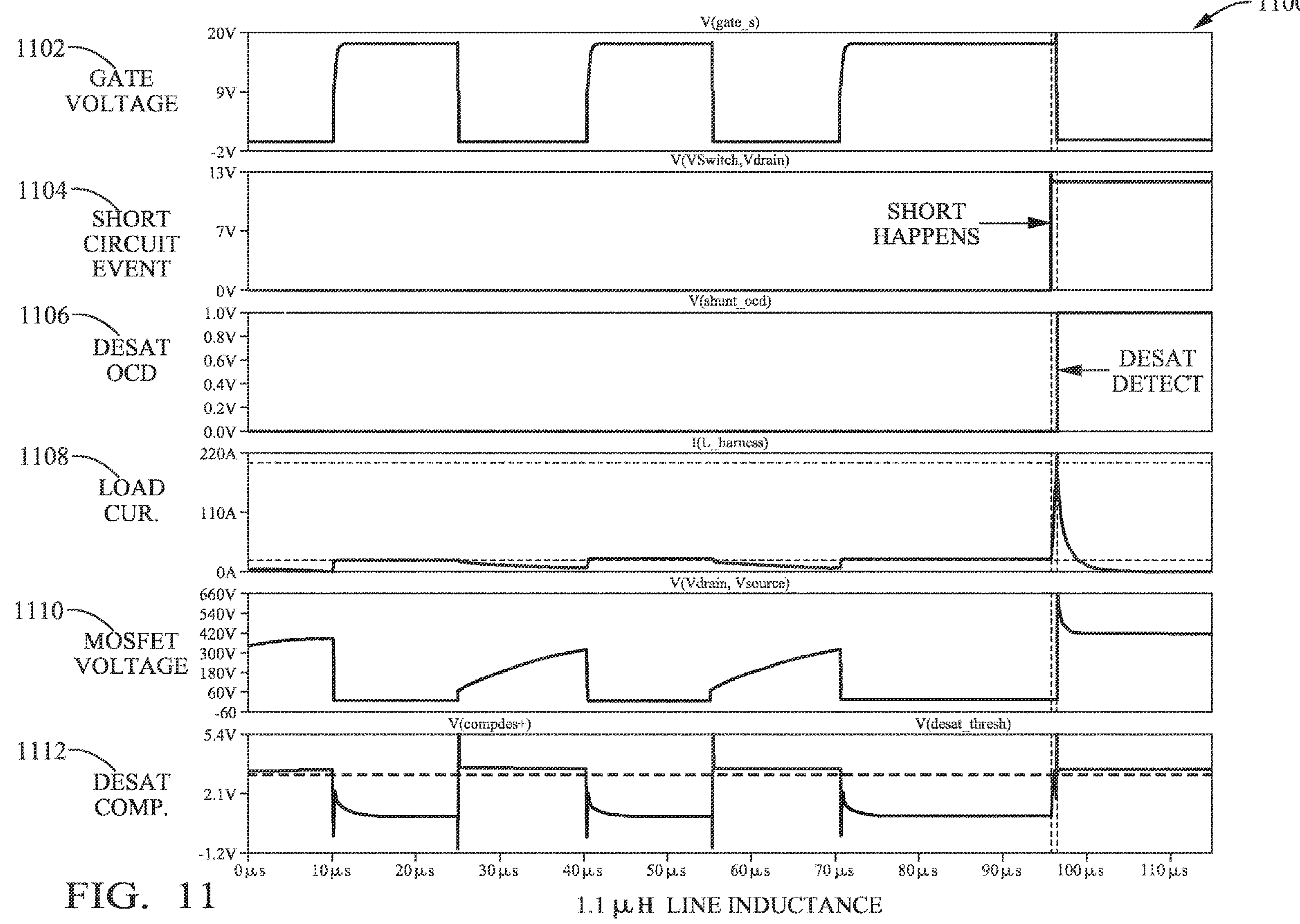
FIG. 11 illustrates graphs of various parameters for a second simulation of a desaturation-based over current event of the SSR module of FIG. 1 according to some embodiments.

FIG. 11 shows the results of a second simulation of a DESAT OCD circuit 204 of the SSR module 100. In this simulation, the high side electronic switch 106 has a 1.1 pH line impedance. The graphs of the voltage 1102 at the gate of the high side electronic switch 106, the short circuit event 1104, the DESAT OCD signal 1106, the current 1108 through the electrical load 104, the voltage 1110 across the high side electronic switch 106, and the DESAT comparator 212 voltage 1112 are shown in in FIG. 11.

Figure 12:
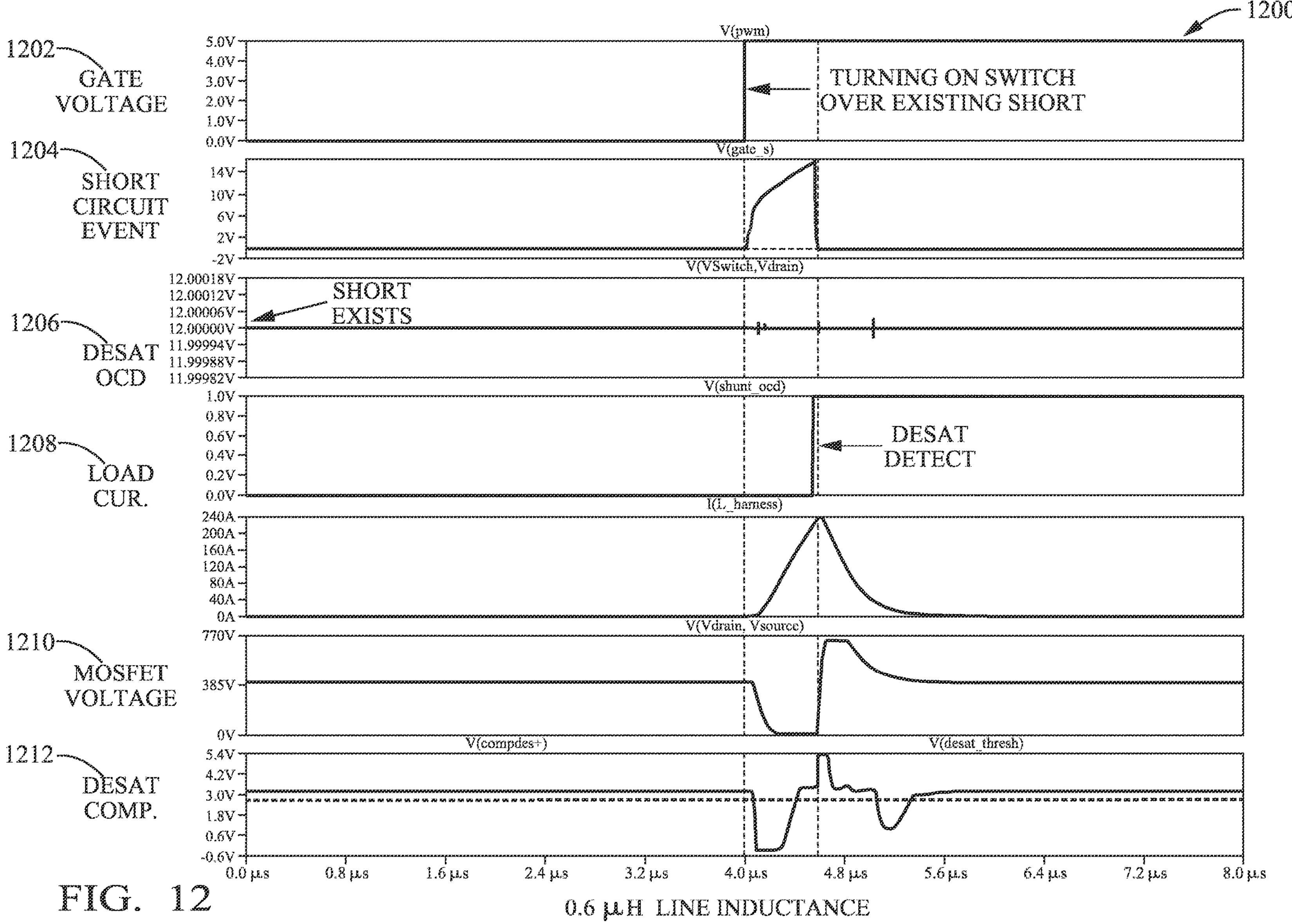
FIG. 12 illustrates graphs of various parameters for a first simulation of a SSR turn-on over current event of the SSR module of FIG. 1 according to some embodiments.

FIG. 12 shows the results of a first simulation of a turn on over short of the SSR module 100 with a DESAT OCD circuit 204. In this simulation, the high side electronic switch 106 has a 0.6 pH line impedance. The graphs of the voltage 1206 at the gate of the high side electronic switch 106, the short circuit event 1204, the DESAT OCD signal 1128, the current 1208 through the electrical load 104, the voltage 1210 across the high side electronic switch 106, and the DESAT comparator 212 voltage 1212 are shown in FIG. 12. As can be seen in FIG. 12, the SSR module 100 turns off the high side electronic switch 106 less than 380 nanoseconds after the DESAT OCD signal 1128 occurs.

Figure 13:
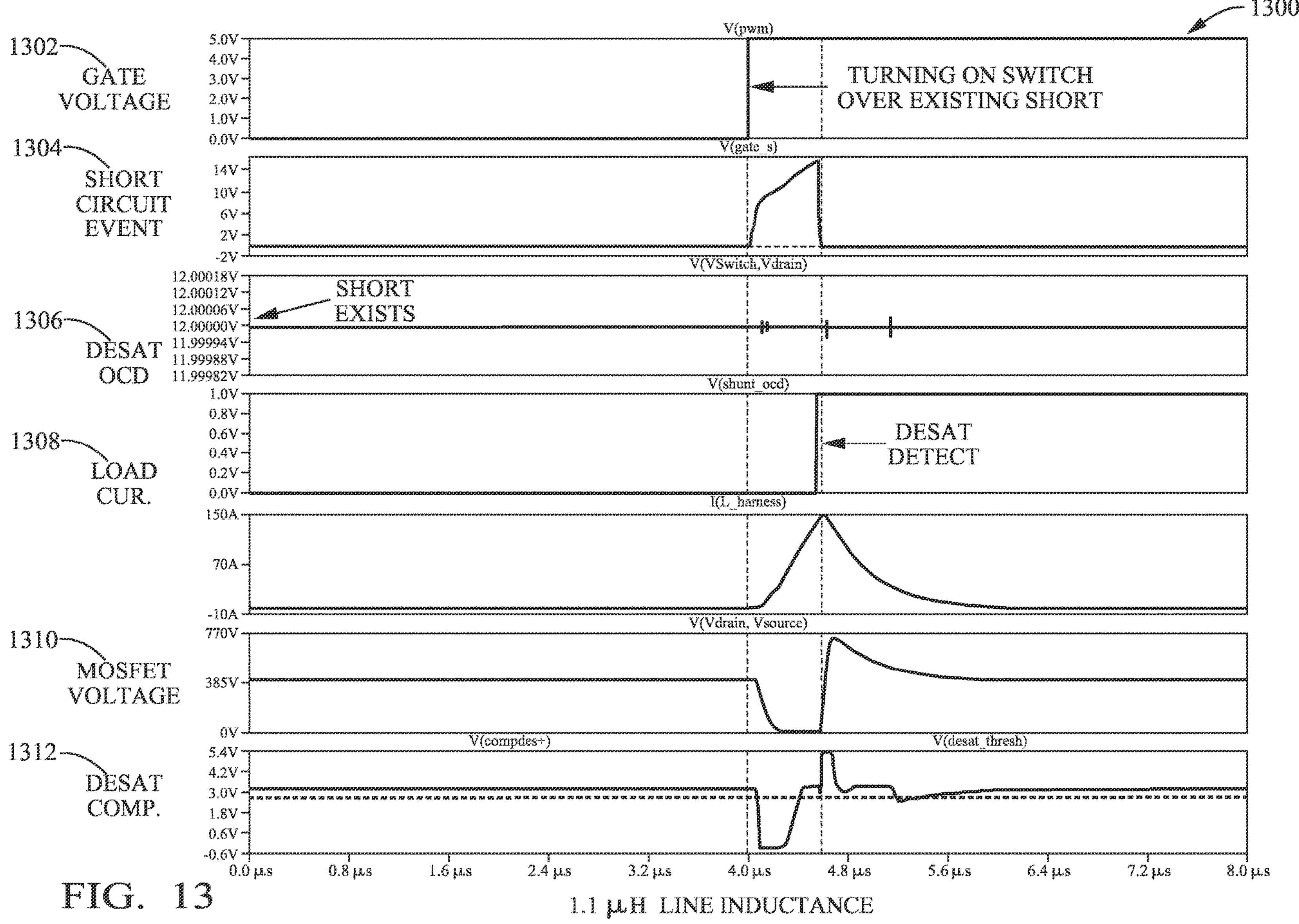
FIG. 13 illustrates graphs of various parameters for a second simulation of a SSR turn-on over current event of the module of FIG. 1 according to some embodiments.

FIG. 13 shows the results of a second simulation of a turn on over short of the SSR module 100 with a DESAT OCD circuit 204. In this simulation, the high side electronic switch 106 has a 1.1 pH line impedance. The graphs of the voltage 1302 at the gate of the high side electronic switch 106, the short circuit event 1304, the DESAT OCD signal 1306, the current 1308 through the electrical load 104, the voltage 1310 across the high side electronic switch 106, and the DESAT comparator 212 voltage 1312 are shown in FIG. 13. As can be seen in FIG. 13, the relay module turns off the gate less than 380 nanoseconds after the DESAT OCD signal 1306 occurs.

DISCUSSION OF POSSIBLE EMBODIMENTS

The following are non-exclusive descriptions of possible embodiments of the present invention.

In some aspects, the techniques described herein relate to a solid state relay module, including a first electronic switch configured to establish and break an electrical connection between a first voltage input and a first voltage output; a drive circuit connected to the first electronic switch and configured to put the first electronic switch in a conductive state or in a nonconductive state due to commands from an electronic controller in communication with the drive circuit; a shunt overcurrent detection circuit in communication with the electronic controller; and a desaturation overcurrent detection circuit in communication with the electronic controller, wherein the electronic controller is configured to command the drive circuit to put the first electronic switch in the nonconductive state when the shunt overcurrent detection circuit or the desaturation overcurrent detection circuit detects an overcurrent condition.

The solid state relay module of the preceding paragraph can optionally include, additionally and/or alternatively any, one or more of the following features, configurations and/or additional components.

In some aspects, the techniques described herein relate to a solid state relay module, further including: a second electronic switch configured to establish and break an electrical connection between a second voltage input and a second voltage output distinct from the first voltage input and first voltage output.

In some aspects, the techniques described herein relate to a solid state relay module, wherein the first and second electronic switches are metal-oxide-semiconductor field-effect transistors.

In some aspects, the techniques described herein relate to a solid state relay module, wherein the electronic controller is configured to command the drive circuit to put the first electronic switch in a nonconductive state less than 200 nanoseconds after the shunt overcurrent detection circuit detects an overcurrent condition.

In some aspects, the techniques described herein relate to a solid state relay module, wherein the electronic controller is configured to command the drive circuit to put the first electronic switch in the nonconductive state less than 150 nanoseconds after the shunt overcurrent detection circuit detects the overcurrent condition.

In some aspects, the techniques described herein relate to a solid state relay module, wherein the shunt overcurrent detection circuit detects the overcurrent condition when a load current exceeds a current threshold.

In some aspects, the techniques described herein relate to a solid state relay module, wherein the electronic controller is configured to command the drive circuit to put the first electronic switch in the nonconductive state less than 500 nanoseconds after the desaturation overcurrent detection circuit detects an overcurrent condition.

In some aspects, the techniques described herein relate to a solid state relay module, wherein the electronic controller is configured to command the drive circuit to put the first electronic switch in the nonconductive state less than 390 nanoseconds after the desaturation overcurrent detection circuit detects an overcurrent condition.

In some aspects, the techniques described herein relate to a solid state relay module, wherein the desaturation overcurrent detection circuit detects an overcurrent condition when a voltage across the first electronic switch exceeds a voltage threshold.

In some aspects, the techniques described herein relate to a solid state relay module, wherein the electronic controller is configured to command the drive circuit to send a pulse width modulated signal to the first electronic switch in order to pre-charge an electrical load connected to the solid state relay module.

In some aspects, the techniques described herein relate to a solid state relay module, wherein the electronic controller is configured to command the drive circuit to periodically put the first electronic switch in a conductive state for a predetermined first time period and put the first electronic switch in a nonconductive state for a predetermined second time period in order to pre-charge the electrical load.

In some aspects, the techniques described herein relate to a solid state relay module, wherein the electronic controller determines the first and second time periods based on a temperature of the electrical load.

In some aspects, the techniques described herein relate to a solid state relay module, wherein the first time period is between 200 to 500 nanoseconds and the second time period is about 20 microseconds.

In some aspects, the techniques described herein relate to a solid state relay module, including a first electronic switch configured to establish and break an electrical connection between a first voltage input and a first voltage output; and a drive circuit connected to the first electronic switch and configured to put the first electronic switch in a conductive state or in a nonconductive state due to commands from an electronic controller in communication with the drive circuit.

The solid state relay module of the preceding paragraph can optionally include, additionally and/or alternatively any, one or more of the following features, configurations and/or additional components.

In some aspects, the techniques described herein relate to a solid state relay module, further including: a second electronic switch configured to establish and break an electrical connection between a second voltage input and a second voltage output distinct from the first voltage input and first voltage output.

In some aspects, the techniques described herein relate to a solid state relay module, wherein the first and second electronic switches are metal-oxide-semiconductor field-effect transistors.

In some aspects, the techniques described herein relate to a solid state relay module, wherein the electronic controller is configured to command the drive circuit to send a pulse width modulated signal to the first electronic switch in order to pre-charge an electrical load connected to the solid state relay module.

In some aspects, the techniques described herein relate to a solid state relay module, wherein the electronic controller is configured to command the drive circuit to periodically put the first electronic switch in a conductive state for a predetermined first time period and put the first electronic switch in a nonconductive state for a predetermined second time period in order to pre-charge the electrical load.

In some aspects, the techniques described herein relate to a solid state relay module, wherein the electronic controller determines the first and second time periods based on a temperature of the electrical load.

In some aspects, the techniques described herein relate to a solid state relay module, wherein the first time period is between 200 to 500 nanoseconds and the second time period is about 20 microseconds.

While the invention has been described with reference to an exemplary embodiment(s), it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention is not limited to the disclosed embodiment (s), but that the invention will include all embodiments falling within the scope of the appended claims.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an", and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any particular order, order of operations, direction or orientation unless stated otherwise.

The invention claimed is:

1. A solid state relay module, comprising:

a first electronic switch configured to establish and break an electrical connection between a first voltage input and a first voltage output;

a drive circuit connected to the first electronic switch and configured to put the first electronic switch in a conductive state or in a nonconductive state due to commands from an electronic controller in communication with the drive circuit;

a shunt overcurrent detection circuit in communication with the electronic controller; and a desaturation overcurrent detection circuit in communication with the electronic controller, the shunt overcurrent detection circuit and the desaturation overcurrent detection circuit are configured as independent overcurrent detection paths, and the electronic controller being configured to command the drive circuit to put the first electronic switch directly into the nonconductive state in response to detection of an overcurrent condition by either the shunt overcurrent detection circuit or the desaturation overcurrent detection circuit.

2. The solid state relay module in accordance with claim 1, further comprising:

a second electronic switch configured to establish and break an electrical connection between a second voltage input and a second voltage output distinct from the first voltage input and first voltage output.

3. The solid state relay module in accordance with claim 2, wherein the first and second electronic switches are metal-oxide-semiconductor field-effect transistors.

4. The solid state relay module in accordance with claim 1, wherein the electronic controller is configured to command the drive circuit to put the first electronic switch in the nonconductive state less than 200 nanoseconds after the shunt overcurrent detection circuit detects the overcurrent condition.

5. The solid state relay module in accordance with claim 4, wherein the electronic controller is configured to command the drive circuit to put the first electronic switch in the nonconductive state less than 150 nanoseconds after the shunt overcurrent detection circuit detects the overcurrent condition.

6. The solid state relay module in accordance with claim 4, wherein the shunt overcurrent detection circuit detects the overcurrent condition when a load current exceeds a current threshold.

7. The solid state relay module in accordance with claim 1, wherein the electronic controller is configured to command the drive circuit to put the first electronic switch in the nonconductive state less than 500 nanoseconds after the desaturation overcurrent detection circuit detects the overcurrent condition.

8. The solid state relay module in accordance with claim 7, wherein the electronic controller is configured to command the drive circuit to put the first electronic switch in the nonconductive state less than 390 nanoseconds after the desaturation overcurrent detection circuit detects the overcurrent condition.

9. The solid state relay module in accordance with claim 7, wherein the desaturation overcurrent detection circuit detects the overcurrent condition when a voltage across the first electronic switch exceeds a voltage threshold.

10. The solid state relay module in accordance with claim 1, wherein the electronic controller is configured to command the drive circuit to send a pulse width modulated signal to the first electronic switch in order to pre-charge an electrical load connected to the solid state relay module.

11. The solid state relay module in accordance with claim 10, wherein the electronic controller is configured to command the drive circuit to periodically put the first electronic switch in a conductive state for a predetermined first time period and put the first electronic switch in a nonconductive state for a predetermined second time period in order to pre-charge the electrical load.

12. The solid state relay module in accordance with claim 11, wherein the electronic controller determines the first and second time periods based on a temperature of the electrical load.

13. The solid state relay module in accordance with claim 11, wherein the first time period is between 200 to 500 nanoseconds and the second time period is about 20 microseconds.

14. A solid state relay module, comprising:

a first electronic switch configured to establish and break an electrical connection between a first voltage input and a first voltage output;

a drive circuit individually connected to the first electronic switch and configured to put the first electronic switch in a conductive state or in a nonconductive state due to commands from an electronic controller in communication with the drive circuit; and a shunt overcurrent detection circuit and a desaturation overcurrent detection circuit, each in communication with the electronic controller, the electronic controller being configured to command the drive circuit to place the first electronic switch in the nonconductive state in response to an overcurrent condition detected by either the shunt overcurrent detection circuit or the desaturation overcurrent detection circuit.

15. The solid state relay module in accordance with claim 14, further comprising:

a second electronic switch configured to establish and break an electrical connection between a second voltage input and a second voltage output distinct from the first voltage input and first voltage output.

16. The solid state relay module in accordance with claim 15, wherein the first and second electronic switches are metal-oxide-semiconductor field-effect transistors.

17. The solid state relay module in accordance with claim 14, wherein the electronic controller is configured to command the drive circuit to send a pulse width modulated signal to the first electronic switch in order to pre-charge an electrical load connected to the solid state relay module.

18. The solid state relay module in accordance with claim 17, wherein the electronic controller is configured to command the drive circuit to periodically put the first electronic switch in a conductive state for a predetermined first time period and put the first electronic switch in a nonconductive state for a predetermined second time period in order to pre-charge the electrical load.

19. The solid state relay module in accordance with claim 18, wherein the electronic controller determines the first and second time periods based on a temperature of the electrical load.

20. The solid state relay module in accordance with claim 18, wherein the first time period is between 200 to 500 nanoseconds and the second time period is about 20 microseconds.

* * * * *